United States Patent

Witriol et al.

[11] 4,047,001
[45] Sept. 6, 1977

[54] ENCODING ALTIMETER

[76] Inventors: Norman M. Witriol, 2501 Lancelot Drive SE., Huntsville, Ala. 35803; Carlton L. Frederick, 518 Dryden Road, Ithaca, N.Y. 14850

[21] Appl. No.: 664,592

[22] Filed: Mar. 8, 1976

Related U.S. Application Data

[62] Division of Ser. No. 533,576, Dec. 17, 1974, Pat. No. 3,961,272.

[51] Int. Cl.$^2$ .......................... G01V 1/28; G01L 7/20
[52] U.S. Cl. .................................. 235/151.3; 73/384; 235/92 MT; 307/220 R; 328/150
[58] Field of Search ................. 235/151.3, 150.3, 194, 235/92 MT; 328/135, 136, 150, 41, 44, 48; 307/220 R, 222; 73/384, 386, 179

[56] References Cited

U.S. PATENT DOCUMENTS

| 3,280,937 | 10/1966 | Faber, Jr. et al. | 307/220 R |
| 3,500,022 | 3/1970 | Toscano | 307/222 R |
| 3,510,772 | 5/1970 | Luthi | 235/194 |
| 3,681,586 | 8/1972 | Kitaura | 235/194 |
| 3,943,341 | 3/1976 | Corsi et al. | 235/150.3 |
| 3,968,401 | 7/1976 | Bryant | 307/222 R |

*Primary Examiner*—Malcolm A. Morrison
*Assistant Examiner*—Errol A. Krass
*Attorney, Agent, or Firm*—Nathan Edelberg; Robert P. Gibson; Freddie M. Bush

[57] ABSTRACT

The pressure of the atmosphere is sensed by a pressure transducer which causes a resistance to vary. The variance of this resistor is converted to a variable frequency. The number of cycles of this frequency in a set amount of time is counted by a counter and displayed by a digital display.

2 Claims, 2 Drawing Figures

ENCODING ALTIMETER

DEDICATORY CLAUSE

The invention described herein may be manufactured, used, and licensed by or for the Government for governmental purposes without the payment to us of any royalties thereon.

CROSS REFERENCE TO RELATED APPLICATION

This is a division of application Ser. No. 533,576, filed Dec. 17, 1974, now U.S. Pat. No. 3,961,272 issued June 1, 1976.

BACKGROUND OF THE INVENTION

The field of the invention is related to altimeters and vertical velocity altimeters. Current altimeters use an aneroid barometer which mechanically moves three hands around a circular dial to display altitude. Current encoding altimeters use this type display together with various expensive means of converting this information to the code necessary for input to the aircraft transponder for transmission to a ground facility. Current ordinary vertical velocity indicators use an aneroid barometer with a pinhole in the static system to provide information on the rate of altitude change. This information is displayed to the pilot by a mechanically moving hand rotating around a circular dial. Current instantaneous vertical velocity indicators function in a similar manner except that they have a mechanical system which compensates for the delay time in the ordinary vertical velocity indicator. The ordinary vertical velocity indicator's cost is comparable with that of an altimeter, and the instantaneous vertical velocity indicator is roughly three times the cost of the ordinary variety. The current encoding altimeter cost is about 10 times the cost of an altimeter. General devices to warn pilots of an approaching preset altitude are nonexistent due to the fact that they would have to be self-contained and thus be very expensive. Specific devices to warn of minimum altitudes do exist and are exceedingly expensive.

It is noted that many instruments in the panel of the prior art are of the dial variety and due to the large number of these dials situated around the cockpit, assimilation and interpretation of information by the pilot is difficult and time consuming.

SUMMARY OF THE INVENTION

A pressure transducer made up of a barometer with a movable plate controls the amount of light falling on a photocell by a light emitting diode. The resistance of this photocell is measured and converted into a variable frequency in accordance with the amount of resistance. A clock activates a flip flop which in turn activates an AND gate to which the variable frequency is also connected. The output of the AND gate is fed to a counter. After a predetermined time the flip flop and the AND gates are turned off, and the count on the counter is displayed by a digital display to indicate the altitude. This count is also sent to and stored in an up/down counter. The clock will once again reset the flip flop, which in turn resets the AND gate, and the counter will once again start to count the number of cycles in the variable frequency over the counting period of time.

DESCRIPTION OF THE PREFERRED EMBODIMENT

Altimeter devices may be used such as a barometer which directly connects to vary a potentiometer to change its resistance. Another technique would be to connect the aneroid barometer to a capacitor plate. The varying altitude would cause a varying capacitance and then in FIG. 1 instead of using a resistance to frequency chip 16, one would use a capacitance to frequency circuit. An additional similar technique would be to connect the aneroid barometer to an inductance slug. The varying altitude would cause a varying inductance and then in FIG. 1 instead of a resistance to frequency chip 16, one would use an inductance to frequency circuit. As is well known, the height of an airship is inversely proportional to atmosphere pressure.

Figure 2:
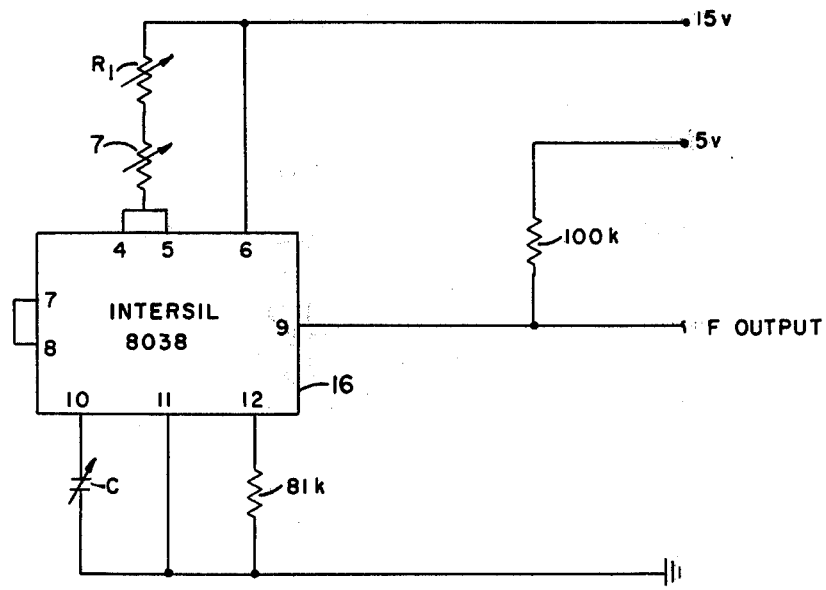
FIG. 2 is a schematic showing of a voltage control oscillator.

FIG. 2 shows that the resistance of the photocell 7 is connected in a circuit to a "resistance to frequency chip" 16. This block 16 may by any of the well known voltage control oscillators such as the Intersil 8038 cip. A 15 volts dc supply is connected through variable resistors R1 and 7 to the input of the voltage control oscillator 16 so as to control its output frequency in accordance with the value of the resistors R1 and 7. Resistor R1 is a barometer trim resistor used to calibrate the barometer with respect to atmospheric conditions. Capacitor C is an instrument scale adjuster.

Figure 1:
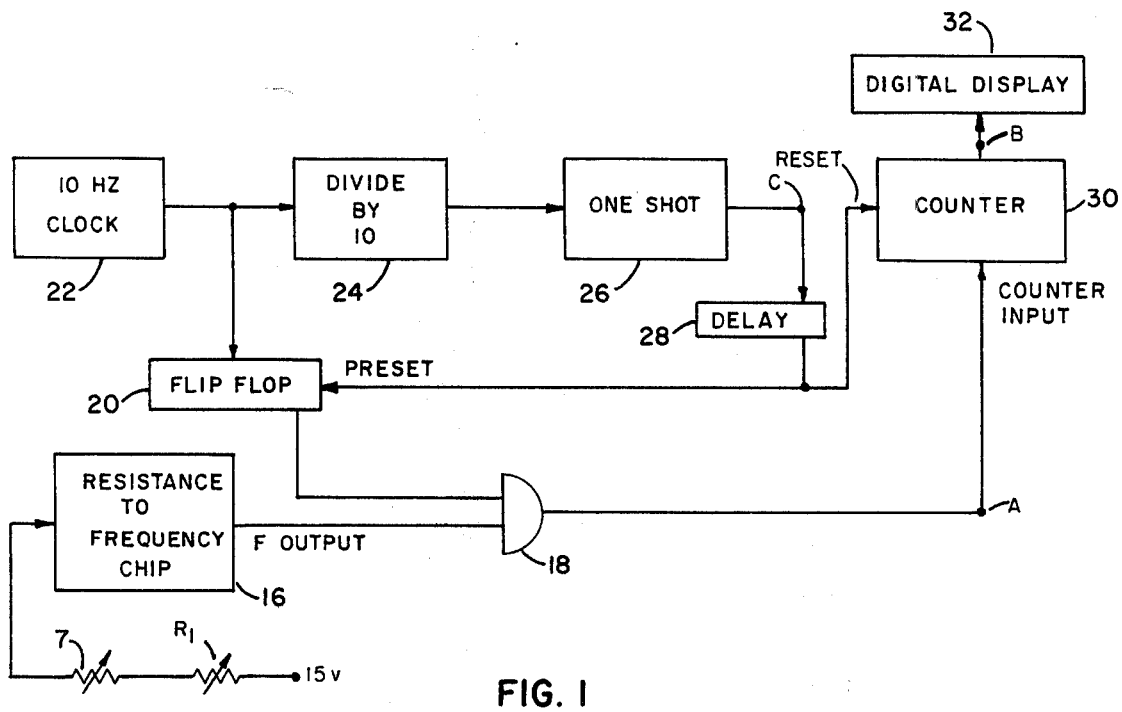
FIG. 1 is a block diagram illustrating a portion of a digital altimeter.

In FIG. 1 it can be seen that the output of the resistance to frequency chip 16 is fed to one input of an AND gate 18. The other input of the AND gate 18 is connected to an output of a flip flop 20. The set input of flip flop 20 is connected to an output of a 10 Hz clock 22. When the flip flop is in a preset condition, the output of the flip flop is positive, therefore, enabling AND gate 18. A divide by 10 circuit 24, a one shot multivibrator 26 and a delay device 28 are connected in series between the output of the clock and the preset of flip flop 20. Any of the well known divide by ten circuits, one shot circuits and delay devices may be used. The one shot 26 is also connected through the delay 28 to a reset input of a three decade counter 30. The counter is programmed to reset to a minus altitude in order to provide an altitude offset capability through resistor R. In the present case, we programmed it to reset to 900 (which is equivalent to −100) instead of to 000. Any of the well known counters and digital displays 32 may be used.

In the operation of FIG. 1 the analog input, which is the amount of resistance of the altimeter, causes a frequency to be generated by chip 16 which is proportional to the resistance. The frequency is counted for one clock cycle of clock 22 by counter 30 (minus the small delay caused by delay device 28).

The frequency output of voltage control oscillator 16 causes the AND gate 18 to go on and off in accordance to the value of the frequency. This will in effect produce pulses to the input of a three decade counter 30. These pulses are counted until clock 22 causes flip flop 20 to go into its set condition. The output of flip flop 20 then goes to 0 (or minus) and disenables AND gate 18. This stops the count of counter 30. The count is displayed digitally by a digital display 32 which in effect is a display of the frequency of block 16. Digital display 32 displays the count for nine cycles of clock 22 plus the time of delay 28, after which time the one shot 22 resets counter 30, presets a flip flop 20, and the process cycles over again.

The amount of time delay caused by delay 28 is small when compared to one clock cycle. It is less than one hundredth of a clock cycle. Delay 28 prevents the resetting of counter 30 until its count is fed into point B. The frequency F output of chip 16 can be calibrated so that the number read on digital display 32 is equal to the airship's height in feet (or in meters, inches, etc.).

In the digital altimeter circuitry of FIG. 1 delay circuit 28 can be eliminated if a vertical velocity indicator function (not shown) is not used with the system. If a vertical velocity indicator function is to be used, the indicator would be connected at points A, B, and C of FIG. 1. The frequency input to be measured and compared is coupled from point A. The number to be counted down is fed from point B, and the reset input is fed from point C. The operation of a vertical velocity indicator is disclosed in conjunction with FIGS. 2 and 4 of U.S. Pat. No. 3,961,272, cross referenced to hereinabove.

It is to be understood that the form of the invention, herewith shown and described is to be taken as a preferred example of the same, and that various changes in the arrangement of parts may be resorted to, without departing from the spirit and scope of the invention. Accordingly, the scope of the invention is to be limited only by the claims appended hereto.

We claim:

1. A system comprising: a signal whose amplitude is to be measured; first means having an input and an output, said signal being connected to the input of said first means, said first means having an output which has a frequency proportional to the amplitude of said signal; counting means for counting the number of cycles in a predetermined amount of time of the output of said first means, said counting means having an input, a reset input, and an output; gating means having two inputs and an output, the output of said first means being connected to one of the inputs of said gating means, and the output of said gating means being connected to the input of said counting means; timing means having first and second outputs, said first output being connected to the other input of said gating means for providing a voltage output over said predetermined amount of time in a cyclic manner over a second larger predetermined amount of time; said gating means passing the output of said first means to the input of said counting means when said timing means is producing a voltage output, and said gating means having no output when said timing means is not producing a voltage output; said timing means having a second output connected to the reset input of said counting means for producing a voltage output at said second output just prior to the starting of the first predetermined amount of time to reset the count of said counting means; said timing means repeating its output functions in a predetermined number of clock cycles, said first output having a voltage thereon for a first clock cycle, and said second output having a voltage thereon for a second clock cycle just prior to said first clock cycle; and wherein said timing means comprises a clock means producing clock cycles at its output; a divide by ten means having an input connected to the output of said clock means; a one shot circuit means having an input connected to an output of said divide by ten means and having an output which represents the second output of the timing means; a flip-flop circuit having two inputs and an output; said clock means having an output connected to one of the inputs of said flip-flop; said one shot circuit means having its output connected to the other input of said flip-flop means; the output of said flip-flop means being the first output of said timing means; said flip-flop having a voltage output when said one shot means has a voltage output; said flip-flop having no output when said one shot does not have an output; and a digital display means being connected to said counting means so as to display the count of the counting means.

2. A system as set forth in claim 1 further comprising an atomspheric pressure sensing means connected to a source so as to produce the signal whose amplitude is to be measured.

* * * * *